(12) United States Patent
Ito

(10) Patent No.: US 7,619,914 B2
(45) Date of Patent: Nov. 17, 2009

(54) SEMICONDUCTOR MEMORY DEVICE

(75) Inventor: Hiroshi Ito, Yokohama (JP)

(73) Assignee: Kabuhsiki Kaisha Toshiba, Tokyo (JP)

( * ) Notice: Subject to any disclaimer, the term of this patent is extended or adjusted under 35 U.S.C. 154(b) by 78 days.

(21) Appl. No.: 12/033,372

(22) Filed: Feb. 19, 2008

(65) Prior Publication Data
US 2008/0198642 A1 Aug. 21, 2008

(30) Foreign Application Priority Data
Feb. 19, 2007 (JP) ............................. 2007-037330

(51) Int. Cl.
*G11C 17/00* (2006.01)
*G11C 17/18* (2006.01)
(52) U.S. Cl. ..................... 365/96; 365/225.7
(58) Field of Classification Search ............... 365/96
See application file for complete search history.

(56) References Cited
U.S. PATENT DOCUMENTS
6,570,795 B1 5/2003 Fricke et al.
7,046,569 B2 * 5/2006 Ito et al. ..................... 365/225
2008/0198643 A1 * 8/2008 Shin et al. ..................... 365/96
2009/0027973 A1 * 1/2009 Nakayama et al. ...... 365/189.05

OTHER PUBLICATIONS

Hiroshi Ito, et al., Pure CMOS One-time Programmable Memory using Gate-Ox Anti-fuse, Proceedings of the IEEE Custom Integrated Circuits Conference, 2004, pp. 469-472.

* cited by examiner

*Primary Examiner*—Son L Mai
(74) *Attorney, Agent, or Firm*—Oblon, Spivak, McClelland, Maier & Neustadt, L.L.P.

(57) ABSTRACT

A memory cell includes an antifuse device that is capable of having data written thereto by breakdown of a gate dielectric film by application of a high voltage. A data inversion portion generates, according to a relationship between the sense amplifier's determination and write data to be written to the memory cell, inverted write data obtained by inverting the write data. The data inversion portion also inverts, when data is read from the memory cell to which the inverted write data is written, the read data and reads it.

19 Claims, 11 Drawing Sheets

F I G. 6
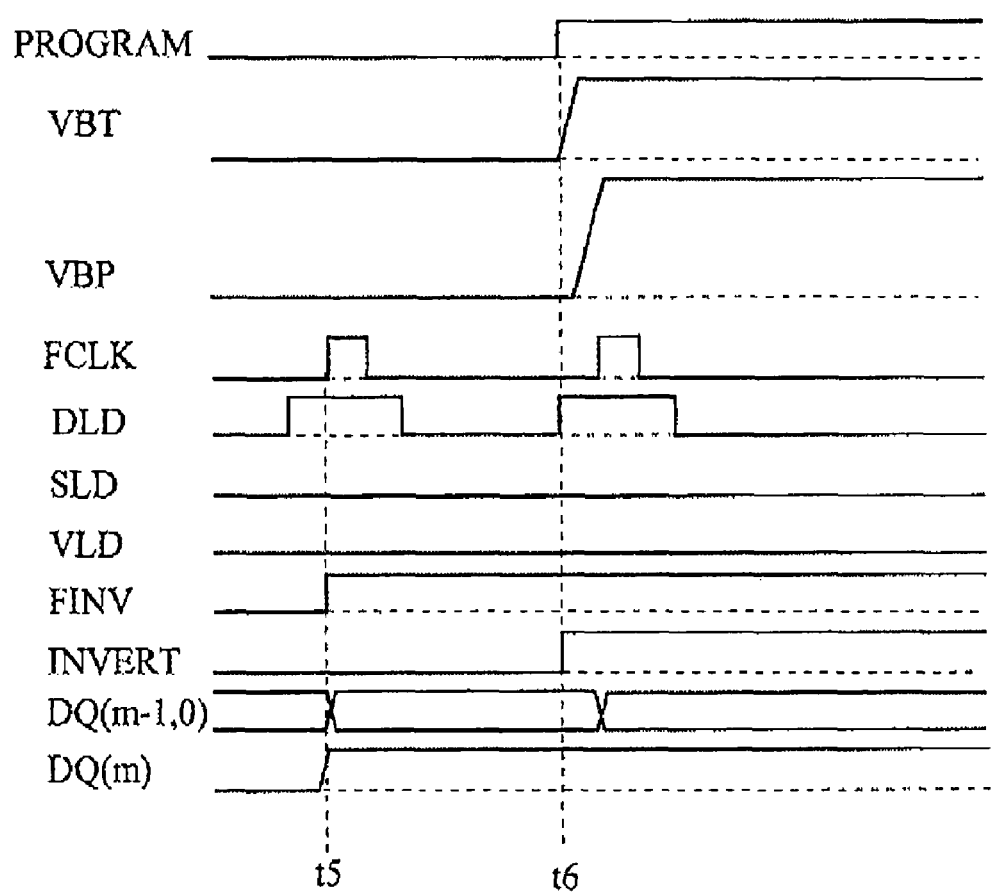

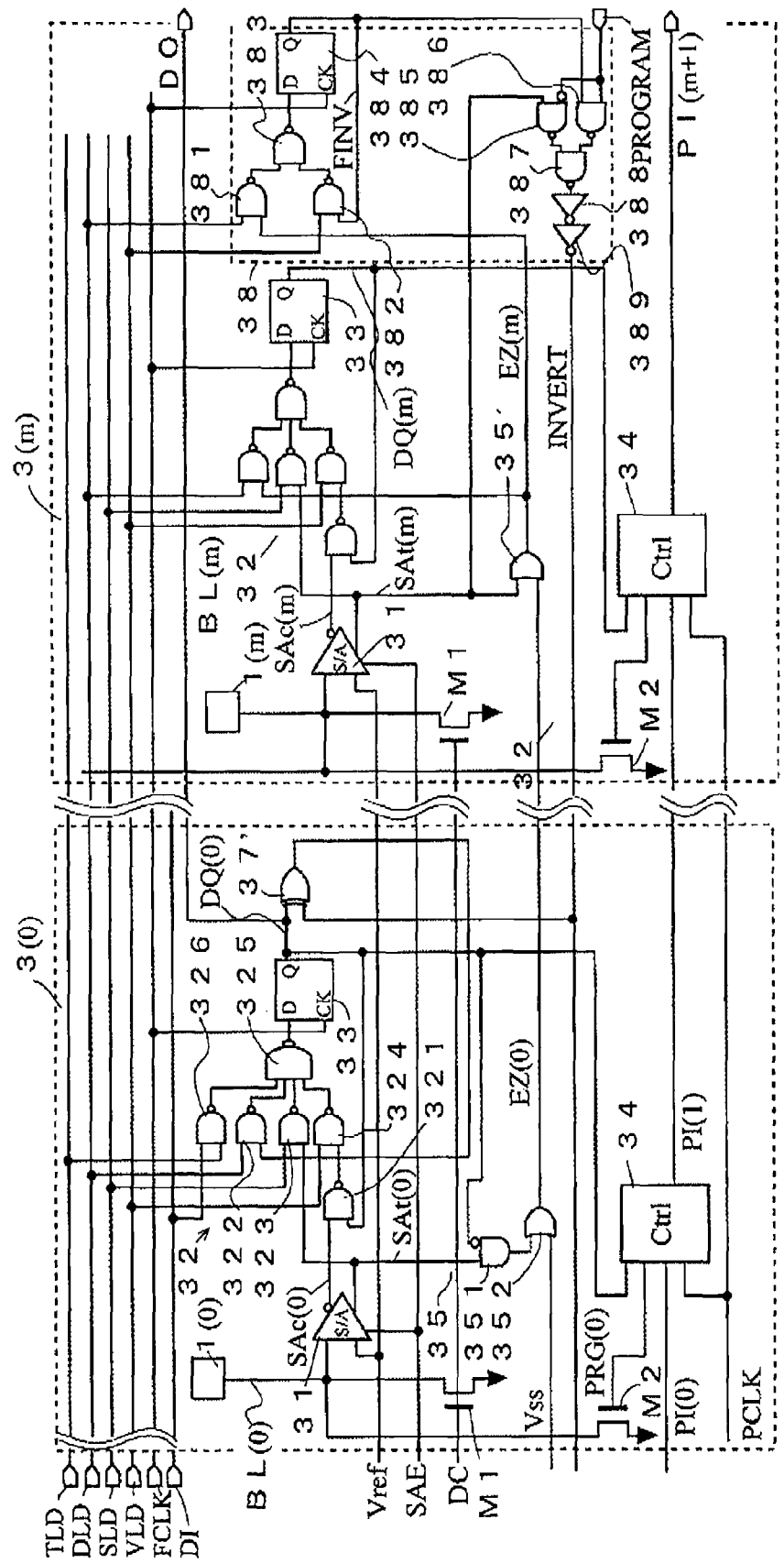

SEMICONDUCTOR MEMORY DEVICE

CROSS REFERENCE TO RELATED APPLICATIONS

This application is based on and claims the benefit of priority from prior Japanese Patent Application No. 2007-37330, filed on Feb. 19, 2007, the entire contents of which are incorporated herein by reference.

BACKGROUND OF THE INVENTION

1. Field of the Invention

The present invention relates to a semiconductor memory device, and more particularly, to an OTP memory including so-called antifuse devices as memory cells.

2. Description of the Related Art

In semiconductor integrated circuits, non-volatile one-time programmable (OTP) memories are essential elements in which no stored data is lost even when the power supply is turned off. The OTP memories are used in a wide range of applications such as redundancies for large-capacity memories such as DRAM and SRAM, tuning of analog circuits, and storing codes such as cipher keys.

One of the conventional OTP memories that have mainly been used is a laser fuse ROM. The laser fuse ROM includes a laser fuse that irreversibly stores information using a laser light blow. The laser fuse ROM requires, however, a special fuse-blow device and a blow process using the device, causing a problem of much test cost. The laser fuse has a problem that its minimum dimension depends on the wavelength of the laser light, so the laser fuse cannot be reduced in dimension falling into step with the other circuit portions and has come to occupy a larger area than the others. The programming method of the laser fuse enables only a wafer-level programming, thus making it hard to perform processes such as fault-segment recovery in a high-speed test after packaging and a built-in self-repair by test circuits mounted in a chip.

As another aspect of the OTP memory, a memory including a so-called gate dielectric film breakdown antifuse device as a memory element is proposed (see, for example, H. Ito et al. "Pure CMOS One-time Programmable Memory using Gate-OX Antifuse", Proceedings of the IEEE 2004 Custom Integrated Circuits Conference, PP. 469-472). The antifuse device can have data written thereto by breakdown of the gate dielectric film of the MOS transistor by application of a high voltage. The antifuse device can also hold data according to the difference of currents through the gate dielectric film due to the presence or absence of the film breakdown. The antifuse device can thus eliminate an additional special process, thereby facilitating mount of the device on a system-on-chip (SoC) where a system is integrated on a chip.

In the OTP memories including the antifuse devices, as MOSFETs become smaller decreasing the gate dielectric film thicknesses, the gate-leak currents in the antifuse devices increase. This reduces the read margin and causes misreading. Specifically, the variation of the gate dielectric film thickness and the variation of the impurity concentration or defect density in the gate dielectric film or the like cause a large variation of the gate-leak current in a large number of memory cells in the OTP memories that include the antifuse devices. An exceptionally large gate-leak current generated even in a very small number of memory cells of a large number of memory cells will reduce the read margin of "0", increasing the possibility that "0" is misread as "1." This will cause the problem of lower yield and reliability.

It is hard to deal with the above problems from an aspect of manufacturing processes. This is because the logic circuits mounted on the same chip will not suffer significant disadvantages from some gate-leak current, so addressing the manufacturing process may affect on the characteristics of the logic circuit transistors. Other measures such as error correction circuits may be possible, but the correction circuits will increase the chip area, inevitably increasing the cost.

SUMMARY OF THE INVENTION

A semiconductor memory device according to an aspect of the present invention includes: a memory cell array including a plurality of memory cells, each memory cell including an antifuse device that is capable of having data written thereto by breakdown of a gate dielectric film of an MOS transistor by application of a high voltage; a bit-line for writing or reading data from the memory cell; a sense amplifier comparing the bit-line's voltage and a reference voltage and determining a difference therebetween; and a data inversion portion generating, according to a relationship between the sense amplifier's determination and write data to be written to the memory cell, inverted write data obtained by inverting the write data, the data inversion portion also inverting, when data is read from the memory cell to which the inverted write data is written, the read data and reading out the inverted data.

BRIEF DESCRIPTION OF THE DRAWINGS

FIG. 6 is a timing chart illustrating write-data inversion operation in a semiconductor memory device of the first embodiment;

FIG. 11 is a circuit diagram of the configuration of the read/write circuit 3(j) in FIG. 10.

DETAILED DESCRIPTION OF THE EMBODIMENTS

With reference to the accompanying drawings, preferred embodiments of the present invention will now be described in more detail.

First Embodiment

[Circuit Configuration]

Figure 1:
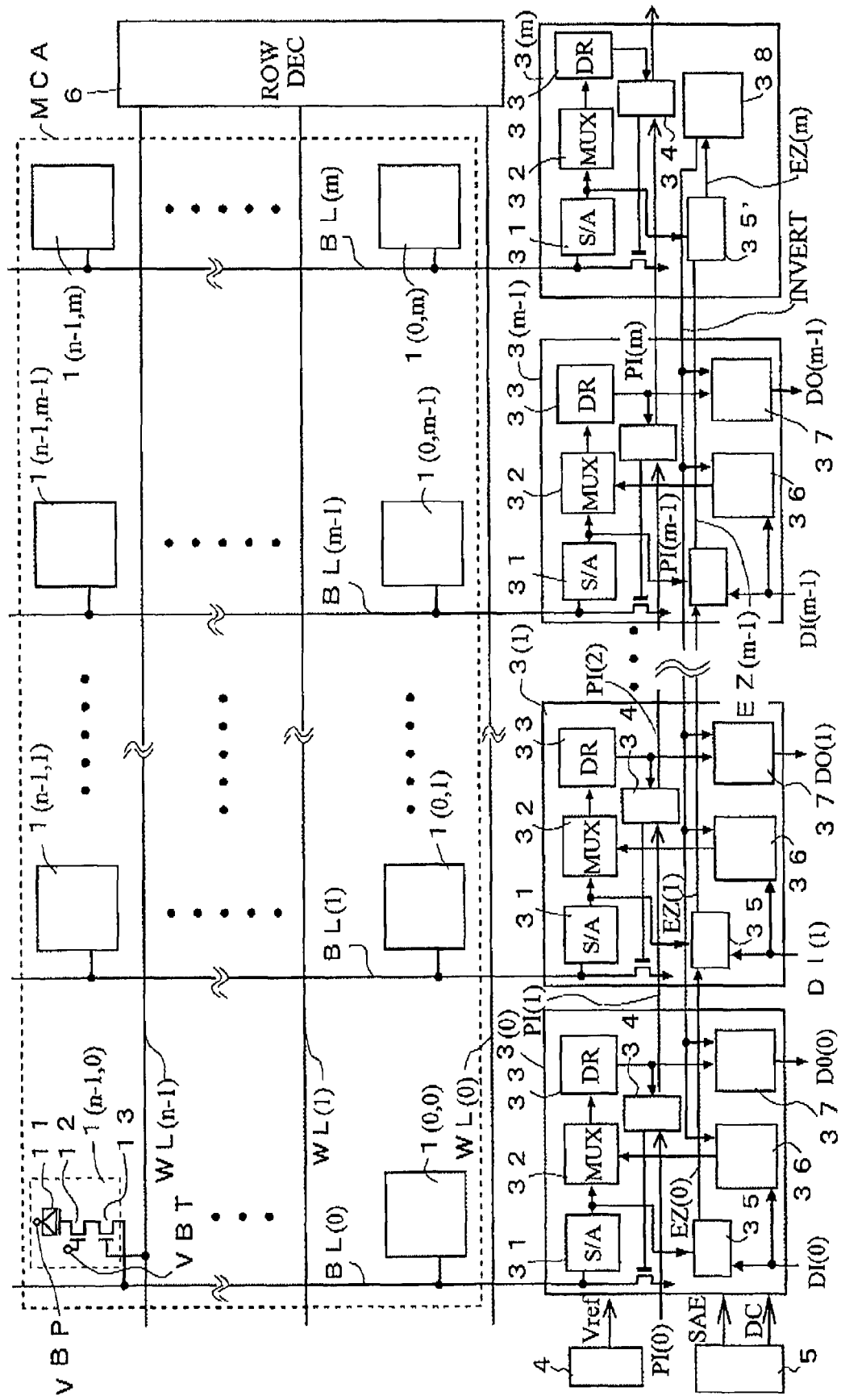
FIG. 1 is a block diagram of the configuration of a semiconductor memory device according to a first embodiment of the present invention.

FIG. 1 is a schematic diagram of the schematic configuration of a non-volatile semiconductor device according to a first embodiment of the present invention. In this embodiment, the non-volatile semiconductor device includes a memory cell array MCA. The MCA includes a plurality of memory cells 1 disposed in a matrix.

The memory cell array MCA includes n word-lines WL(0) to WL(n−1) and (m+1) bit-lines BL(0) to BL(m) provided therein. At the intersections of the word-lines WL(i) and the bit-lines BL(j), the memory cells 1(i, j) are arranged (i=0 to n−1, j=0 to m).

Among the (n×(m+1)) memory cells, the memory cells 1(0, m) to 1(n−1, m) along the right end bit-line BL(m) store redundancy data. The redundancy data is added to the effective data and shows that data inversion described below has been performed.

With reference to FIG. 1, the memory cell 1 includes components such as a dielectric breakdown antifuse device 11 as a memory element, a barrier device 12, and a selection device 13. The configuration of the memory cell 1 is merely shown as an example, and it will be appreciated that a variety of other well-known configurations may be applied.

The antifuse device 11 includes, for example, a p type MOS transistor with source/drain terminals and a substrate shorted. The source/drain terminals may be applied with a high-voltage write power-supply VBP to break down the gate dielectric film. This may thus irreversibly change the resistance of the gate dielectric film to write information to the device 11. Specifically, the antifuse device 11 has a high resistance before the gate dielectric film is broken down, and a low resistance after the gate dielectric film is broken down by the high voltage application. The antifuse device 11 stores, for example, data "0" at the high resistance and data "1" at the low resistance.

The barrier device 12 and the selection device 13 are connected in series between the gate terminal of the antifuse device 11 and the bit-line BL. It is assumed here that both the barrier device 12 and the selection device 13 include an n type MOS transistor.

The barrier device 12 has a gate, to which a barrier power-supply VBT is applied. With the VBT applied, the device 12 serves to prevent the selection device 11 from being applied with a high voltage from the write power-supply VBP. The write power-supply VBP and the barrier power-supply VBT are commonly supplied to all memory cells 1. The supplies VBP and VBT are, however, omitted in FIG. 1 for simplicity. The selection device 11 is turned on by selecting the word-line WL. Note that the word-line WL is selected by a row decoder 6 according to input of an external address signal.

The write operation is performed as follows for example. First, the write power-supply VBP is set to a sufficiently high voltage to break down the gate dielectric film of the antifuse device 11. Then, the barrier power-supply VBT, the word-line WL, arid the bit-line BL are set to certain high voltages at the same time to prevent application of an unnecessary high voltage stress to the antifuse device 11, the barrier device 12, and the selection device 13. When, for example, the antifuse device 11 includes a p type MOS transistor usually driven by a 1.2V power supply, and each of the barrier device 12 and the selection device 13 includes an n type MOS transistor usually driven by a 3 V power supply, it is appropriate to set the write power-supply VBP to a voltage of 6 V and the others (VBT, WL, and BL) to a voltage of 3 V.

Next, the word-line WL connected to the memory cell 1 to be written is set to a selection state i.e., a high voltage of 3 V. The other word lines WL connected to the memory cells 1 not to be written are set to a nonselection state i.e., a low voltage of 0 V. Additionally, the bit-line WBL connected to the memory cell 1 to be written is set to a low voltage of 0 V to instruct write operation. The other write bit-lines WBL are held at a high voltage of 3 V. In this way, one of the memory cells 1 is selected to which the high-voltage word-line WL and the low-voltage write bit-line WBL are connected. Writing data is then started.

A voltage of 6 V is applied across the antifuse device 11 of the selected memory cell 1 from the write power-supply VBP. Keeping this condition for about tens of microseconds to several milliseconds will break down the gate dielectric film of the antifuse device 7 of the selected memory cell 1, though the time depends on the thickness of the gate dielectric film or the temperature. The breakdown locally occurs leaving a pin hole with a diameter of about 50 nm. A high voltage continues to be applied to the small breakdown spot to pass a relatively large current of 2 mA or more. During the write operation, the breakdown spot and the vicinity thereof change in composition, forming a relatively low-resistance conductive path. Then the application of the write power-supply VBP is turned off to stop the write operation.

The data read operation from the memory cell 1 in FIG. 1 will now be described. First, with all word-lines WL held at 0 V, the power-supply VBP is set to a voltage such as 1.2 V, which is used as a power-supply VDD of logic circuits and is low enough not to break down the gate dielectric film. In order to render the barrier device 11 conductive, the barrier power-supply VBT is set to a high voltage such as 2.4 V, twice as large as the power supply VDD. Under this condition, the voltage of the read bit-line BL is initialized. Preferably, the voltage of the read bit-line BL is relatively low so that a sufficient voltage is applied to the antifuse device 11.

The read bit-line BL is then set to a high impedance state. The word-line WL is then selectively set to a high voltage of, for example, 2.4 V, twice as large as the power supply VDD. Under this condition, when the antifuse device 11 stores data of "1", the device 11 has a low resistance, making the voltage of the read bit-line BL, higher than the initial voltage. Conversely, when the antifuse device 11 stores data of "0", the device 11 has a high resistance, keeping the read bit-line BLc at the initial voltage. The voltage differences between these voltages and the reference voltage may be sensed by a sense amplifier circuit 31 described below to determine whether the memory cell 1 stores data "0" or "1."

With reference to FIG. 1, the bit-lines BL(0) to BL(m) have read/write circuits 3(0) to 3(m), respectively, connected thereto. Each read/write circuit serves to read and write data to the memory cell 1.

With reference to FIG. 1, the read/write circuit 3(j) (j=0 to m) includes the sense amplifier circuit 31 that determines whether the memory cell 1 holds data of "1" or "0" according to the reference voltage Vref, a multiplexer 32 transferring the determination of the sense amplifier circuit 31, a data register 33 holding the read data or write data, and a control circuit 34 performing various controls in the data write operation. The reference voltage Vref is generated by the reference voltage generation circuit 4. The voltage Vref is controlled in magnitude for certain purposes described below. The sense amplifier circuit 31 is activated by the sense amplifier activation signal SAE. The bit-line BL is discharged (initialized) by a discharge signal DC before starting the read operation. The sense amplifier activation signal SAE and the discharge signal DC are output at a given time changed by the timer circuit 5 according to a signal from a not-shown control circuit.

In order to rescue the memory cell 1 having a large gate-leak current as described above, each of the read/write circuits 3(0) to 3(m−1) additionally includes a determination circuit 35, a write-data inversion circuit 36, and a read-data inversion circuit 37. Note that the rightmost write circuit 3(m) includes only a determination circuit 35' and does not include the write-data inversion circuit 36 or the read-data inversion circuit 37.

Figure 2:
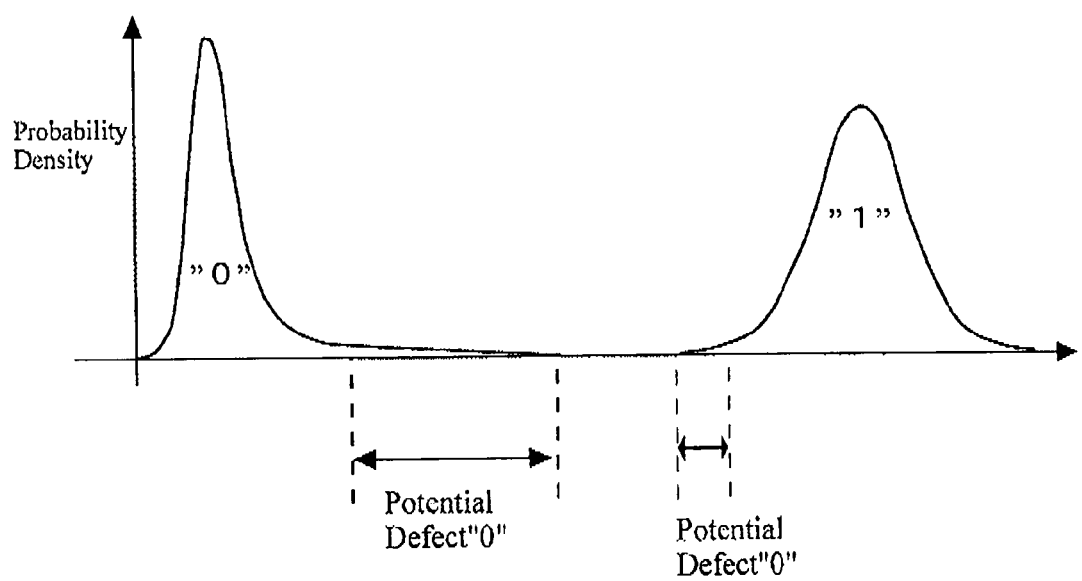
FIG. 2 is a graph of cell-current distribution in a memory cell including an antifuse device: cell current when data is read from a memory cell ("0" cell) without a gate dielectric film broken down and cell current when data is read from a memory cell ("1" cell) with the gate dielectric film broken down.

With reference to FIG. 2, when data is read from the memory cell ("0" cell) without the gate dielectric film broken down, the cell current is less than that from the memory cell ("1" cell) with the gate dielectric film broken down. The "1" cell's current distribution tends to be wider. This is because under the same write condition, in some cells, the antifuse device 11 readily becomes a sufficiently low resistance, and in other cells, the antifuse device 11 becomes an insufficiently low resistance even after several repetitions of the write operation.

In some of the cells that have an insufficiently low resistance, the bit-line voltage is increased only to a value not much different from the reference voltage, so such cells may be misread ("1" is determined as "0") in some conditions (hereinafter such a memory cell is referred to as a "potential faulty "1" cell"). The potential faulty "1" cell is repeatedly subject to a verify operation to detect a cell with an insufficiently low resistance, and to a re-write operation performed to the detected cells. This may provide a sufficiently high bit-line voltage, suppressing the misreading of the cells.

In contrast, the current distribution of the "0" cell before the write operation has a long tail on the right side (on the high voltage side). This is because as the memory cells become smaller, the gate dielectric films become thinner, thus increasing the memory cells that have an exceptionally large gate-leak current as described above.

In some reading conditions, the memory cell in the long tail portion causes misreading ("0" is determined as "1"). Such a memory cell is hereinafter referred to as a "potential faulty "0" cell."

It is hard to address the potential faulty "0" cell with the verify operation unlike the potential faulty "1" cell. The reading condition may be changed to increase the read margin for the "0" data, which reduces, however, the read margin for the "1" data. In order to rescue the potential faulty "0" cell, this embodiment includes the determination circuit 35, the write-data inversion circuit 36, and the read-data inversion circuit 37. As is evident from the description below, these circuits may be formed smaller than an error correction circuit or the like. The potential faulty "0" cells may thus be rescued without increase in the circuit area or cost.

In this embodiment, in order to detect the potential faulty "0" cell, the reference voltage is set to a value Vref0 smaller than the usual value Vref, (Vref0<Vrefn), and the read margin for the "0" data is set smaller than the read margin for the "1" data. Then, data of the memory cell 1 is determined by the sense amplifier circuit 31 according to the reference voltage Vref0. The potential faulty "0" cell may thus be detected. The above procedure to detect the potential faulty "0" cell is hereinafter referred to as a "'0'margin test." Note that the reference voltage Vref is controlled by the reference voltage generation circuit 4 according to a signal from a not-shown external circuit signal.

The determination circuit 35 compares the determination ("1", "0") of the sense amplifier circuit 31 in the "0" margin test and the write data DI(j) ("1", "0") to be written to the memorycell 1. When the former and the latter have the following relationship (1), the determination circuit 35 sets the output signal EZ(j) to "1" In the other relationships (2) to (4), the circuit 35 sets the output signal EZ(j) to "0." Note, however, that even in (2) to (4), when the determination circuit 35 in the preceding read/write circuit 3(j−1) outputs a signal EZ(j−1) of "1", the output EZ(j) is set to "1" (the front read/write circuit 3(0) does not receive EZ(j−1), and is instead applied with the ground voltage Vss).

(1) in the "0" margin test, the sense amplifier circuit 31 has a determination of "1", and the write data DI(j) is "0."
(2) in the "0" margin test, the sense amplifier circuit 31 has a determination of "1", and the write data DI(j) is "1."
(3) in the "0" margin test, the sense amplifier circuit 31 has a determination of "0", and the write data DI(j) is "1."
(4) in the "0" margin test, the sense amplifier circuit 31 has a determination of "0", and the write data DI(j) is "0."

Specifically, each determination circuit 35 sets the EZ(j) to "1" if the memory cell 1(i, j) is the potential faulty "0" cell and the write data DI(j) to the memory cell 1(i, j) is "0." Even in other cases, each determination circuit 35 sets the EZ(j) to "1", when the preceding-stage determination circuit 35 outputs a signal EZ(j−1) of "1." The write-data inversion is thus instructed as described below.

Note that the read/write circuit 3(m) connected to the bit-line BL(m) includes the determination circuit 35'. Unlike the determination circuits 35 in the read/write circuits 3(0) to 3(m−1), the determination circuit 35' sets the output signal EZ(m) to "1", when the determination of the sense amplifier 31 in the read/write circuits 3(m) is "1" or the output signal EZ(m−1) of the preceding determination circuit 35 is "1."

When it receives the output signal EZ(m) "1", an inversion instruction circuit 38 sets the inversion instruction signal INVERT to "1" and outputs the resulting signal to the write-data inversion circuits 36 and the read-data inversion circuits 37 in the read/write circuits 3(0) to 3(m−1) in the previous-stages.

Each write-data inversion circuit 36 of the read/write circuits 3(0) to 3(m−1) has a function of inverting the write data DI(j) when the inversion instruction signal INVERT is "1." The circuit 36 also has a function of directly passing through the write data DI(j) when the inversion instruction signal INVERT is "0."

When the inversion instruction signal. INVERT is "1", each read-data inversion circuit 37 of the read/write circuits 3(0) to 3(m−1) inverts data stored in the data register 33 and outputs the inverted data as read data DO(j). When the inversion instruction signal INVERT is "0", the circuit 37 does not invert data stored in the data register 33 and directly outputs the data as read data DO(j).

Figure 3:
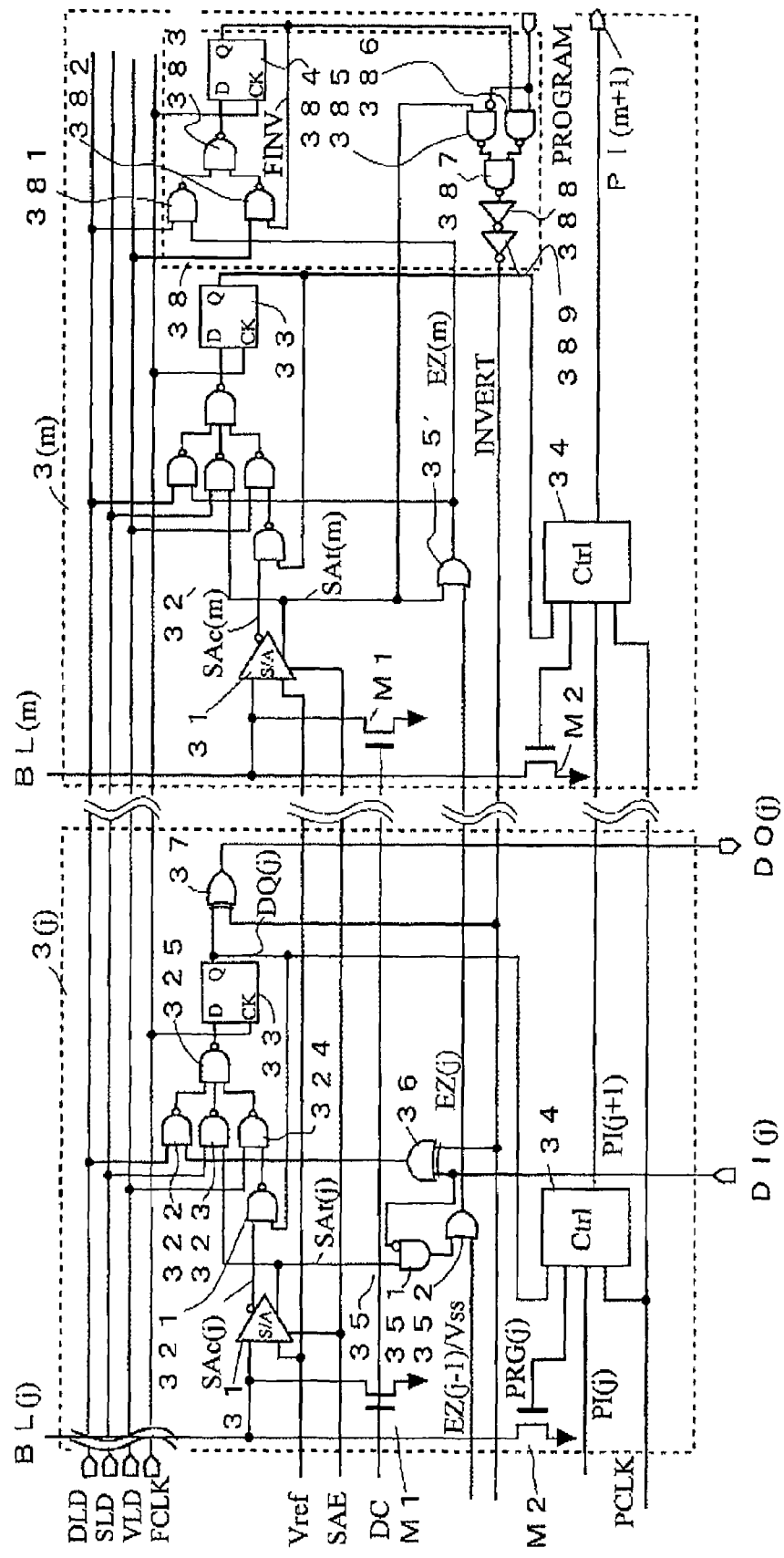
FIG. 3 is a circuit diagram of the configuration of the read/write circuit 3(j) in FIG. 1.

FIG. 3 shows a specific example configuration of the read/write circuit 3(j)(j=0 to m−1) and the read/write circuit 3(m). Note that the read/write circuits 3(0) to 3(m−1) have the same configurations so only one read/write circuit 3(j) is shown in FIG. 3 as a representative of the circuits.

The sense amplifier circuit 31 has an input terminal provided with a bit-line BL(j) and the reference voltage Vref. The circuit 31 is activated by the sense amplifier activation signal SAE. The voltage of the bit-line BL(j) is initialized to the Vss level via a discharge transistor M1 when the discharge signal DC becomes "H."

The bit-line BL(j) has one end connected to a transistor M2. The transistor M2 is on/off controlled by a write signal PRG(j). The signal PRG(j) is provided from the control circuit 34 and changes its logic according to write data DI(j).

The multiplexer 32 includes five NAND gates 321 to 325. The NAND gate 321 makes a logical AND of a complementary output signal SAc(j) of the sense amplifier circuit 31 and an output signal of the data register 33. The gate 321 then produces and outputs the inverted signal of the logical AND. The NAND gate 322 makes a logical AND of an output signal of the write-data inversion circuit 36 and a control signal DLD. The gate 322 then produces and outputs the inverted signal of the logical AND. The NAND gate 323 makes a logical AND of a true output signal SAt(j) of the sense amplifier circuit 31 and a control signal SLD. The gate 323 then produces and outputs the inverted signal of the logical AND. The NAND gate 324 makes a logical AND of an output signal of the NAND gate 321 and a control signal VLD. The gate 324 then produces and outputs the inverted signal of the logical AND. The NAND gate 325 makes a logical AND of output signals of the NAND gates 322 to 324. The gate 325 then produces and outputs the inverted signal of the logical AND. Each of the control signals DLD, SLD, and VLD selectively rises to "1" at a predetermined time depending on the type of the operation such as the read operation, the write operation, and the verify operation.

The data register 33 includes a flip-flop circuit. The flip-flop circuit latches an output signal of the multiplexer 32 according to a clock signal FCLK and outputs the latched signal externally.

The control circuit 34 receives a write-start signal PI(j) from the previous-stage read/write circuit 3(j−1) (for j=1 to m−1) or a not-shown external circuit (for j=0). The circuit 34 also receives an output signal (held data) of the data register 33.

The control circuit 34 then changes a write signal PRG(j) in synchronism with a clock signal PCLK according to the held data of the data register 33.

When the data register 33 holds data of "1", the control circuit 34 operates as follows. When the write-start signal PI(j) is "1", the control circuit 34 raises the write signal PRG(j) to "H" (of about the barrier voltage VBT) in synchronism with the clock signal PCLK. The transistor M2 thus turns on, applying a write voltage to the antifuse device 11 of the selected memory cell 1 to write "1" to the cell 1. The control circuit 34 then raises the write-start signal PI(j+1) to "1" in synchronism with the clock signal PCLK. The circuit 34 then outouts the resulting signal to the control circuit 34 in the next-stage read/write circuit 3(j+1), and returns the write signal PRG(j) to the ground voltage. This stops the write operation of "1" to the memory cell 1 to which the bit-line BL(j) is connected, then shifting to the write operation to the next bit-line BL(j+1).

When the data register 33 holds data of "0", the control circuit 34 operates as follows. When the write-start signal PI(j) is "1", the control circuit 34 changes the write-start signal PI(j+1) to "1" independently of the clock signal PCLK's change. During this operation, the circuit 34 does not raise the write signal PRG to "H" and the memory cell 1 keeps data "0."

In this way, the write-start signal PI(j)="1" is output sequentially from the preceding-stage read/write circuit 3 to the next-stage circuit 3, thereby writing data to one memory cell 1 along one word-line WL for each clock signal PCLK.

The determination circuit 35 includes a logic gate 351 and an OR gate 352. The logic gate 351 receives a true output signal SAt(j) of the sense amplifier circuit 31 and the write data DI(j). The gate 351 produces the inverted signal/DI(j) of the write data DI(j). The gate 351 then produces and outputs a logical AND of the true output signal SAt(j) and the inverted signal/DI(j). When, therefore, the true output signal SAt(j) is "1" and the write data DI(j) is "0", the logic gate 351 outputs an output signal of "1." The OR gate 352 makes a logical OR signal of the output signal EZ(j−1) from the determination circuit 35 in the preceding-stage read/write circuit 3(j−1) and an output signal of the logic gate 351. The gate 352 then outputs the logical OR signal. Note, however, that the OR gate 352 in the front read/write circuit 3(0) does not receive the output signal EZ, and is instead applied with the ground voltage Vss.

The determination circuit 35' in the read/write circuit 3(m) includes only one OR gate. The circuit 35' has two input terminals. One terminal receives a true output signal SAt(m) of the sense amplifier circuit 31 in the read/write circuit 3(m). The other terminal receives an output signal EZ(m−1). The circuit 35' produces and outputs a logical OR signal EZ(m) of these signals.

With reference to FIG. 3, the write-data inversion circuit 36 includes only one EXOR gate. The circuit 36 has input terminals receiving the write data DI(j) and an inversion instruction signal INVERT from the inversion instruction circuit 38, respectively.

When it is necessary to invert the write data DI(j) (i.e., when any of the memory cells 1 along one word-line WL is the potential faulty "0" cell and "0" data is to be stored in that cell 1), the inversion instruction signal INVERT is set to "1." When, therefore, the write data DI(j) is "0", the inversion circuit 36 outputs a signal of "1", and when conversely, the DI(j) is "1", the output signal is "0." The inversion operation is thus performed. The inverted data is stored in the data register 33 via the multiplexer 32 when the control signal SLD, the control signals DLD and VLD are respectively "L", "H", and "L."

When conversely, it is unnecessary to invert the write data DI(j) (i.e. , when none of the memory cells 1 along one word-line WL is the potential faulty "0" cell, or when any of the memory cells 1 along the one word-line WL is the potential faulty "0" cell but data "1" is to be stored in that cell 1), the inversion instruction signal INVERT is set to "0." The write data DI(j) is therefore not inverted and is directly output to the multiplexer 32 (NAND gate 322).

With reference to FIG. 3, the read-data inversion circuit 37 includes one exclusive logical OR gate (EXOR gate). The circuit 37 has input terminals receiving an output signal (held data) of the data register 33 and the inversion instruction signal INVERT, respectively.

With the inversion instruction signal INVERT of "1", when the data register 33 holds data of "0", the read-data inversion circuit 37 outputs a signal of "1". When conversely, the held data is "1", the data inversion circuit 37 outputs a signal of "0." The inversion operation is thus performed, When the inversion instruction signal INVERT is "0", the held data of the data register 33 is not inverted and is directly output.

The inversion instruction circuit 38 in the read/write circuit 3(m) includes NAND gates 381 to 383, a flip-flop circuit 384, a logic gate 385, NAND gates 386 and 387, and inverters 388 and 389. The NAND gate 381 makes a logical AND of the control signal DLD and an output signal EZ(m). The gate 381 then produces and outputs the inverted signal of the logical AND. The NAND gate 382 makes a logical AND of the control signal VLD and an output signal (held data) of the flip-flop circuit 384. The gate 382 then produces and outputs the inverted signal of the logical AND. The NAND gate 383 makes a logical AND of output signals of the NAND gates 381 and 382. The gate 383 then produces and outputs the inverted signal of the logical AND.

The logic gate 385 makes a logical AND of a true output signal SAt(m) of the sense amplifier circuit 31 and a program signal PROGRAM. The signal PROGRAM is "1" in the write operation. The gate 385 produces and outputs the inverted signal of the logical AND. The NAND gate 386 makes a logical AND of an output signal of the flip-flop circuit 384 and the program signal PROGRAM. The gate 386 then produces and outputs the inverted signal of the logical AND. The NAND gate 387 makes a logical AND of output signals of the NAND gate 386 and the logic gate 385. The gate 387 then produces and outputs the inverted signal of the logical AND, The inverters 388 and 389 are connected in series to an output terminal of the NAND gate 387. The signal from the inverter 389 is the inversion instruction signal INVERT.

Operation in First Embodiment

With reference to FIGS. 4 to 9, the operation of a semiconductor memory device in this embodiment will be described.

[Normal Data-Read Operation]

Figure 4:
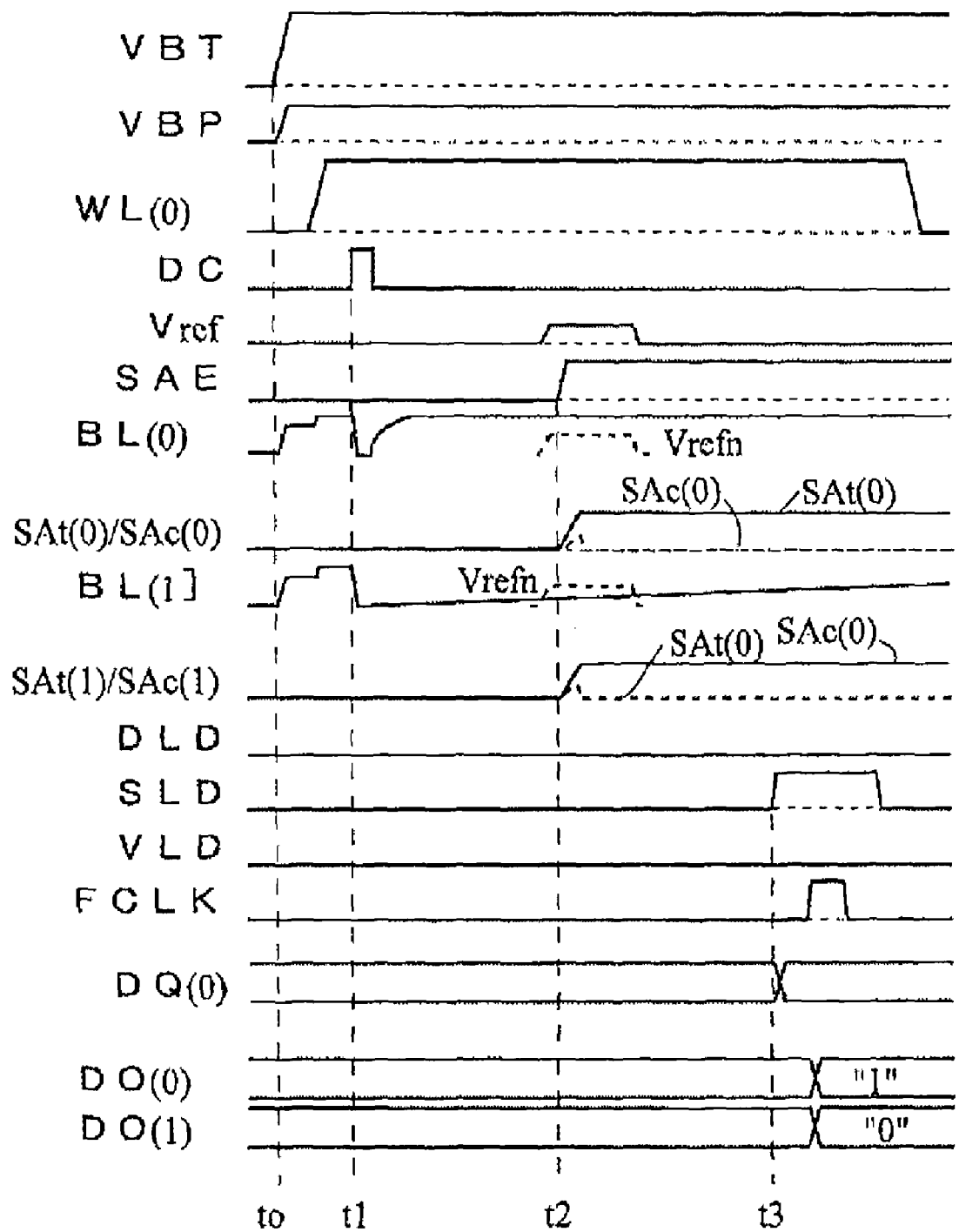
FIG. 4 is a timing chart illustrating data read operation in a semiconductor memory device of the first embodiment.

First, with reference to the timing chart in FIG. 4, the normal data-read operation is described. It is assumed here that data is read from the memory cells 1 along the word-line WL(0), a memory cell 1(0, 0) holds data "1", and a memory cell 1(0, 1) holds data "0."

First at time t0, the write voltage VBP and the barrier voltage VBT rise, and then the word-line WL(0) rises. Then at time t1, the discharge signal DC rises to "H", temporarily discharging the bit-line BL(j) voltage to the ground voltage.

The voltage of the bit-line BL(0) connected to the memory cell (0, 0) holding data "1" then immediately increases. The voltage of the bit-line BL(1) connected to the memory cell (0, 1) holding data "0" increases much more slowly than that of the bit-line BL(0).

The reference voltage generation circuit 4 then gives the reference voltage Vrefn. At time t2, the timer circuit 5 raises the sense amplifier activation signal SAE from "0" to "1", thereby activating the sense amplifier circuit 31. The sense amplifier circuit 31 thus amplifies the difference between the reference voltage Vrefn and the voltage of the bit-line BL. The sense amplifier circuit 31 connected to the bit-line BL(0) provides a true output signal SAt(0) of "1" (VDD) and a complementary output signal SAc(0) of "0" (VSS). The sense amplifier circuit 31 connected to the bit-line BL(1) provides a true output signal SAt(1) of "0" and a complementary output signal SAC(1) of "1."

With the output signals from the sense amplifier circuit 31 thus provided. At time t3, the control signal SLD becomes "H", and thereafter the clock signal FCLK rises. Thereby, thereby read data DQ(j) is held in the data register 33, and the read data DO(j) is output. Note that in the normal read operation described referring to FIG. 4, the reference voltage Vrefn and the period from the falling of the discharge signal DC to the rising of the sense amplifier activation signal SAE may be adjusted by the reference voltage generation circuit 4 and the timer circuit 5 to optimize the read margin.

["0" Margin Test and Determination of Whether Data Inversion Being Necessary or Not]

Figure 5:
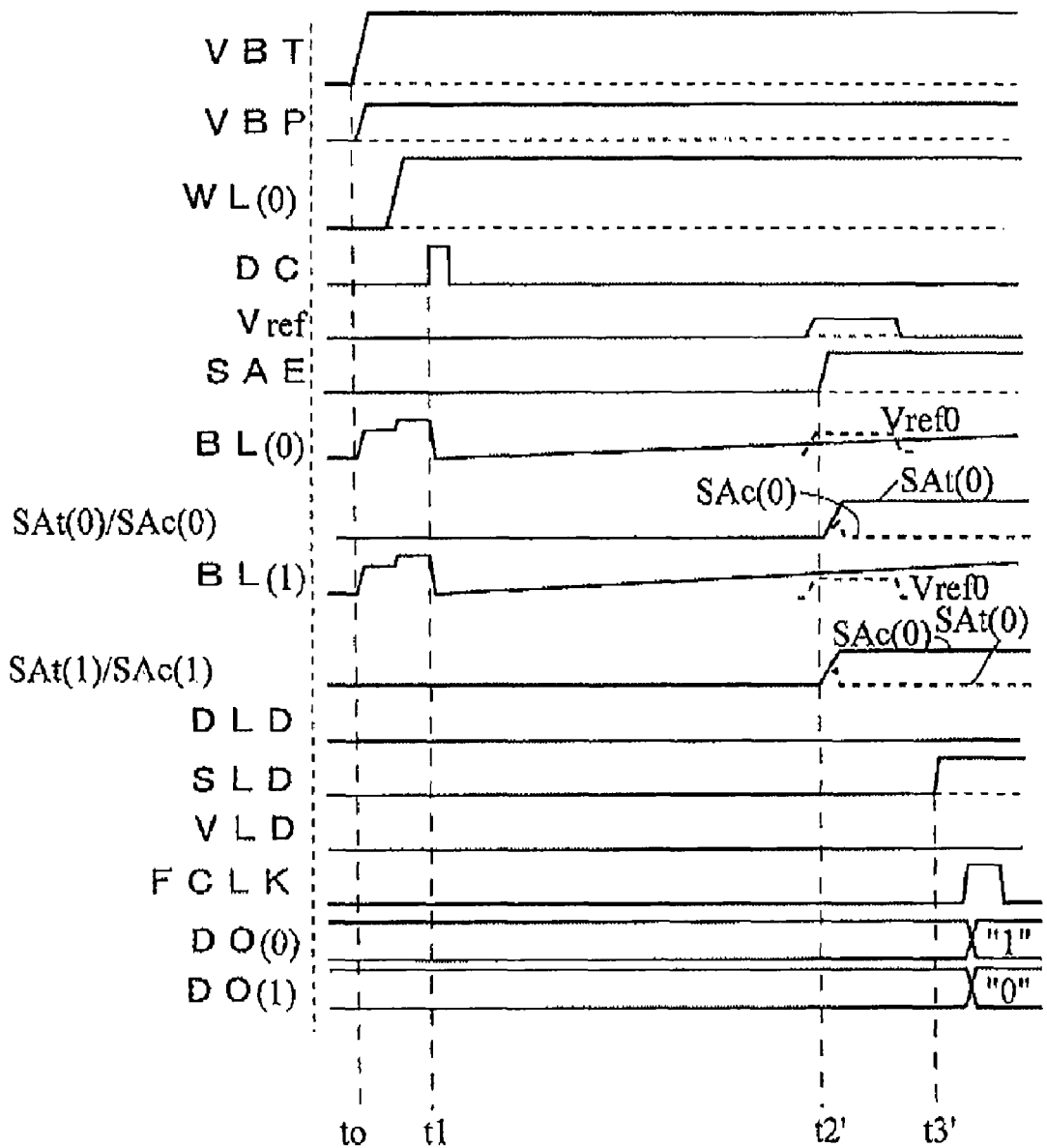
FIG. 5 is a timing chart illustrating operation during a "0" margin test in a semiconductor memory device of the first embodiment.

With reference to FIG. 5, a description is given of the operation in the above "0" margin test and determination of whether the data inversion is necessary or not. In the "0" margin test, the reference voltage Vref is set to Vref0 lower than the normal value Vrefn (Vref0<Vrefn) to detect the potential faulty "0" cell described in FIG. 2. The rising of the sense amplifier activation signal SAE is set slower than that in the normal data read operation (FIG. 4). The read margin of the "0" data is thus set smaller than the read margin of "1" data.

It is assumed here that data is read from the memory cells 1 along the word-line WL(0) and both the memory cell 1(0, 0) and the memory cell 1(0, 1) hold data "0." It is assumed here, however, that the memory cell 1(0, 1) holds data "0", but is the potential faulty "0" cell (see FIG. 2), which has a large gate-leak current and may be misread as "1."

With reference to FIG. 5, therefore, after the discharge signal DC rises at time t1, the bit-line BL(0) increases in voltage very slowly as in FIG. 4, but the bit-line BL(1) increases in voltage slightly faster than the bit-line BL(0). In order to detect this difference, the "0" margin test sets the reference voltage Vref0 smaller than the normal value Vrefn (Vref0<Vrefn), and the sense amplifier activation signal SAF, is generated at time t2' later than that in the normal data-read operation. Data of the memory cell 1(0, 1), which is originally held as "0", is thus misread as "1", and the memory cell 1(0, 1) is determined to be the potential faulty "0" cell (see FIG. 2).

Note that in a similar way, it is also determined whether the redundancy memory cell 1(0, m) is the potential faulty "0" cell or not. In this case, even when it is determined that none of the memory cells 1(0, 0) to (0, m−1) along the same word-line WL(0) are the potential faulty "0" cell, they are to be subject to the write-data inversion as described below.

If it is determined that any of the (m+1) memory cells 1 along one word-line WL(j), for example the memory cell 1(j, 1), is the potential faulty "0" cell and it is also determined that write data to the memory cell 1(j, 1) is "0", the determination circuit 35 outputs a signal EZ(1) of "1." The signal EZ(1) is propagated by the subsequent-stage determination circuit 35, providing the output signal EZ(m) of "1." The output signal EZ(m) of "1" allows performance of the write-data inversion and the read-data inversion described below.

[Write-Data Inversion Operation]

With reference to FIG. 6, a description is given of the write-data inversion operation when it is determined, as described above, that any of the (m+1) memory cells 1(j, 0) to (j, m) along one word-line WL(j) is the potential faulty "0" cell (see FIG. 2) and write data to the memory cell 1 is "0. "

The output signal EZ(m) is "1" when it is determined, as described above, that any of the (m+1) memory cells 1(j, 0) to (j, m) along one word-line WL(j) is the potential. faulty "0" cell and write data to the memory cell 1 is "0." When the output signal EZ(m) is input to the inversion instruction circuit 38, and at time tS the control signal DLD and the clock signal FCLK rise, the output signal FINV (data held in the data register 384) becomes "1", and at the same time, the data DQ(m) held in the data register 33 in the read/write circuits 3(m) becomes "1." The data DQ(m) indicates that the write data is inverted. The DQ(m) thus functions as redundancy data added to the write data DI(0) to (m−1).

Then at time t6, the control signal DLD and the clock signal FCLK rise again for writing data, changing the inversion instruction signal INVERT to "1." The write data DI(j) is thus inverted by the write-data inversion circuit 36. Each inverted data is held in the data register 33. Consider now that, for example, the write data DI(0), DI(1), DI(2), DI(3), ..., and DI(m−1) are (1, 0, 1, 0, ..., 0). When, therefore, the inversion instruction signal becomes "1" it is inverted, allowing the data register 33 to hold data DQ(0), DQI(1), DQ(2), DQ(3), ..., and DQ(m−1) of (0, 1, 0, 1, ..., 1)

[Data Write Operation]

Figure 7:
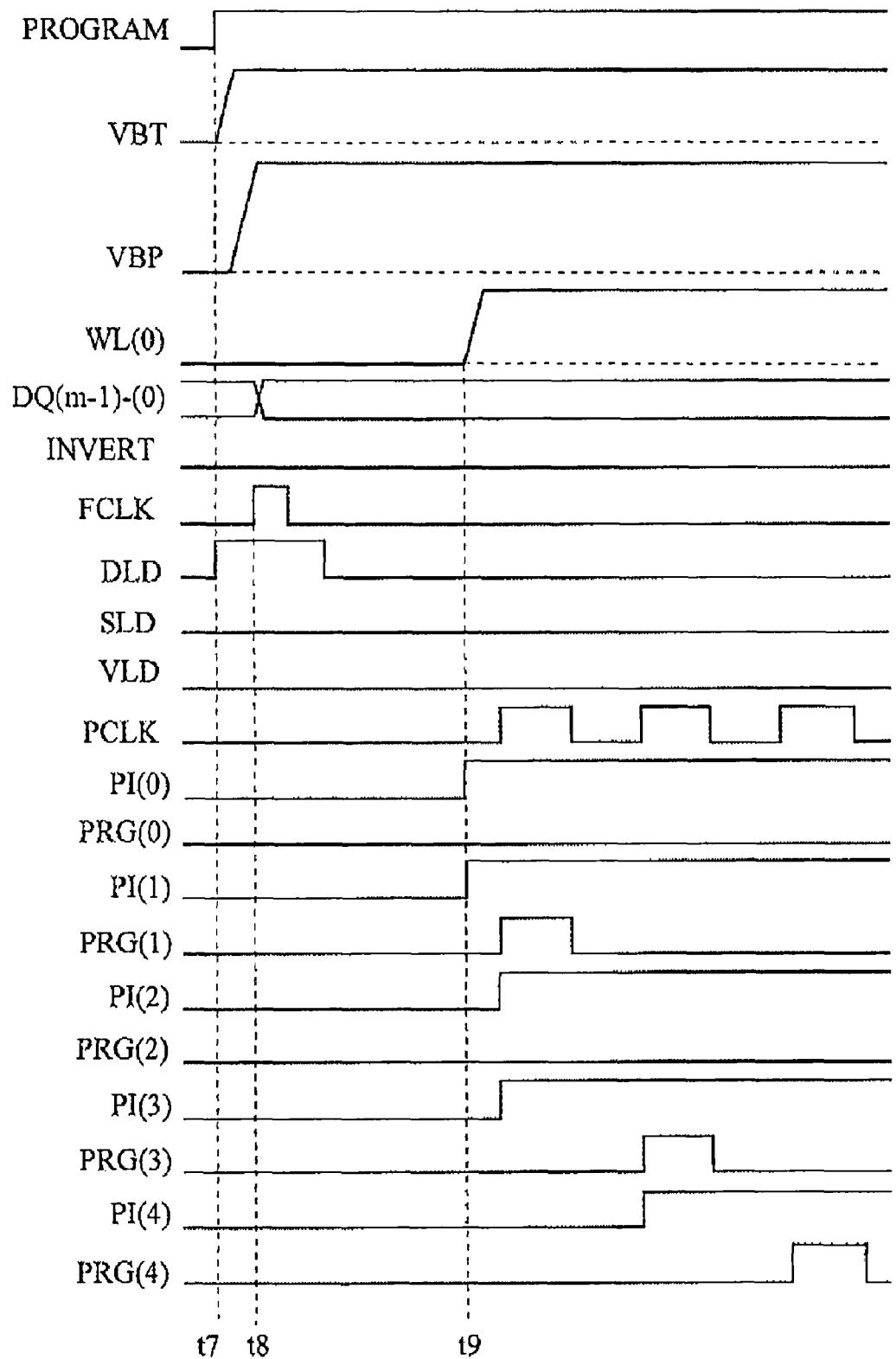
FIG. 7 is a timing chart illustrating data write operation in a semiconductor memory device of the first embodiment.

With reference to FIG. 7, a description is given of the write operation of the write data DI(j) or the inverted write data DI(j) inverted in the above write-data inversion operation. It is assumed in the following description that the data DQ(0); DQI(1), DQ(2), DQ(3), ..., and DQ(m−1) held in the data register 33 are (0, 1, 0, 1, . , 1) and data is written to the memory cells 1 along the word-line WL(0).

At time t7, the signal PROGRAM rises to "1" and the write voltage VBP is boosted. The barrier voltage VBT is then boosted. Then at time t8, the clock signal FCLK rises with the control signal DLD set to "1." The write data DQ(j) stored in the data register 33 is thus read and sent to the control circuit 34.

Then at time t9, the word-line WL(0) rises, and at the same time, the write-start signal PI(0) is output to the control circuit 34 of the read/write circuit 3(0). As described above, when the write data PI(j) is "1", the control circuit 34 of each read/write circuit 3(j) raises the write signal PRG(j) to "H" in synchronism with the clock signal PCLK. The antifuse device 11 is thus written with "1." The circuit 34 then raises the write-start signal PI(j+1) to "1" in synchronism with the clock signal PCLK. The circuit 34 then outputs the raised start signal to the control circuit 34 in the next-stage read/write circuit 3(j+1).

For the data register 33 holding data of "0", when the write-start signal P1(j) becomes "1", the circuit 34 changes the write-start signal PCLK(j+1) to "1" independently of the clock signal PCLK change, allowing the memory cell 1(0, j) to keep data "0." FIG. 7 shows a timing chart when the write data DI(0), DI(1), DI(2), DI(3), and DI(4) are (0, 1, 0, 1, 1).

[Verify Operation and Rewrite Operation]

Figure 8:
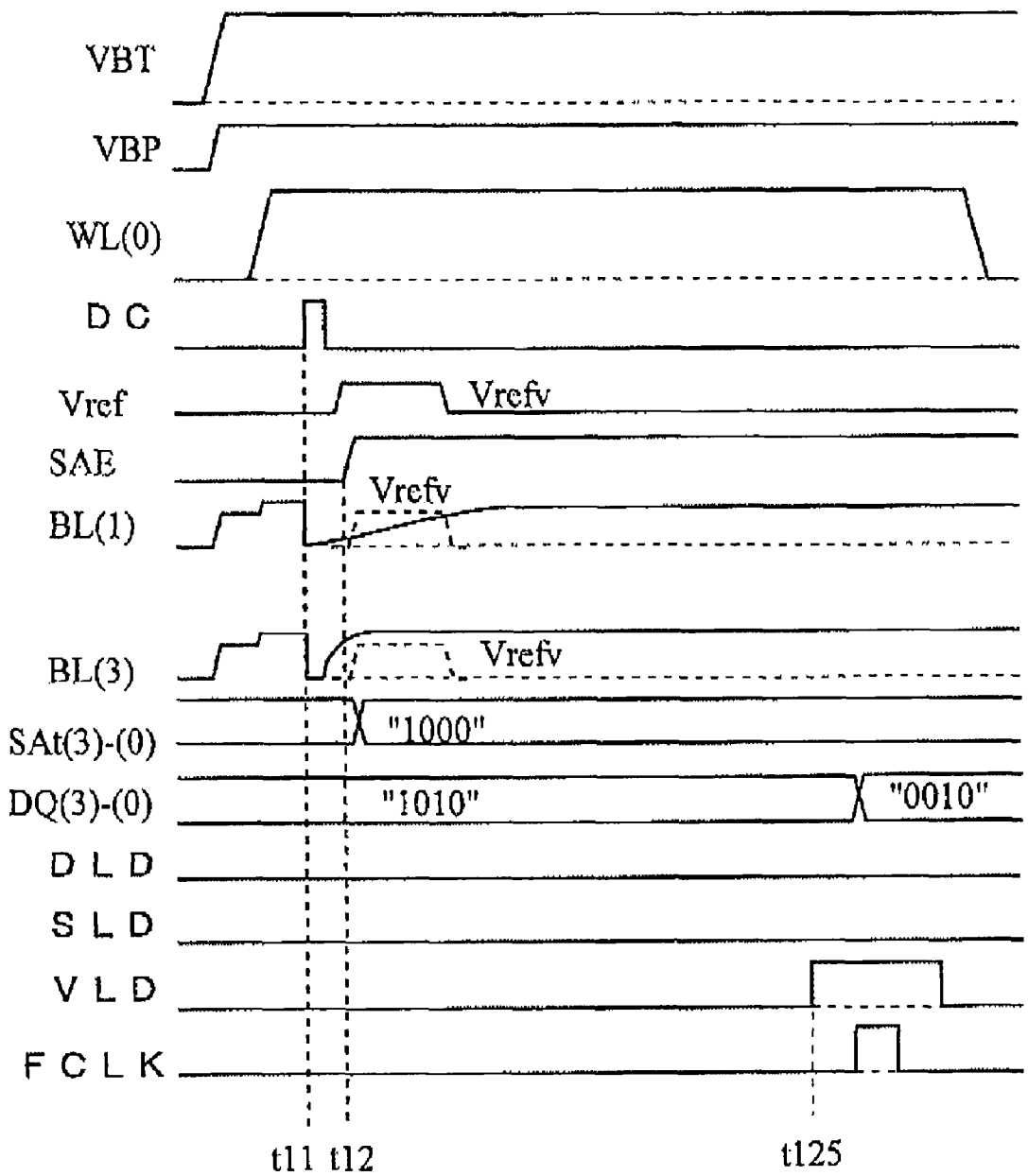
FIG. 8 is a timing chart illustrating verify operation in a semiconductor memory device of the first embodiment.

With reference to FIG. 8, a description is given of a verify operation and a rewrite operation. The verify operation serves to confirm whether the data write operation performed as described above writes data "1" to the desired memory cell 1. The antifuse device 11 is written with data by breakdown of the gate dielectric film by application of a high voltage. When, therefore, the breakdown is weak, some cells are (weakly-written) "1" cells that may be misread as "0." The verify operation detects the weakly-written "1" cells. The detected cells are then subject to the rewrite operations, making the antifuse device 11 to a sufficiently low resistance to provide a sufficient read current (not to be misread as "0").

With reference to FIG. 8, it is assumed that when write data DI(j)=(0, 1, 0, 1) . . . is attempted to be written to the memory cells 1(0, 0), 1(0, 1), 1(0, 2), and 1(0, 3) . . . along the one word-line WL.(0), the memory cell 1(0, 1) becomes the weakly-written "1" cell.

It is also assumed that the reference voltage vref given to the sense amplifier circuit 31 is Vrefvhigher thanthe normal Vrefn. After the discharge signal DC rises at time t11, the voltage of the bit-line BL(1) connected to the weakly-written memory cell (0, 1) increases more slowly than the voltage of the bit-lines connected to the other normal "1" cells (in which the antifuse device 11 has a sufficiently low resistance) such as the bit-line BL(3).

The verify operation detects this difference using the sense amplifier circuit 31 after raising the sense amplifier activation signal SAE at a suitable timing t12. The verify operation thus identifies the weakly-written "1" cell, Specifically, in the read/write circuit 3(i, j) to which the weakly-written "1" cell is connected, the sense amplifier circuit 13 provides the complementary output signal SAt(j) of "1." Then the control signal VLD becomes "1" at time t125 and then the clock signal FCLK rises, thereby holding data DQ(j) of "1" in the corresponding data register 33. Under this condition, a similar procedure to that in the normal write operation may be repeated as the rewrite operation, thereby rewriting data to the weakly-written "1" cell (potential faulty "1" cell) and enhance the reliability of "1" data,

[Read Operation When Inverted Data is Written]

Figure 9:
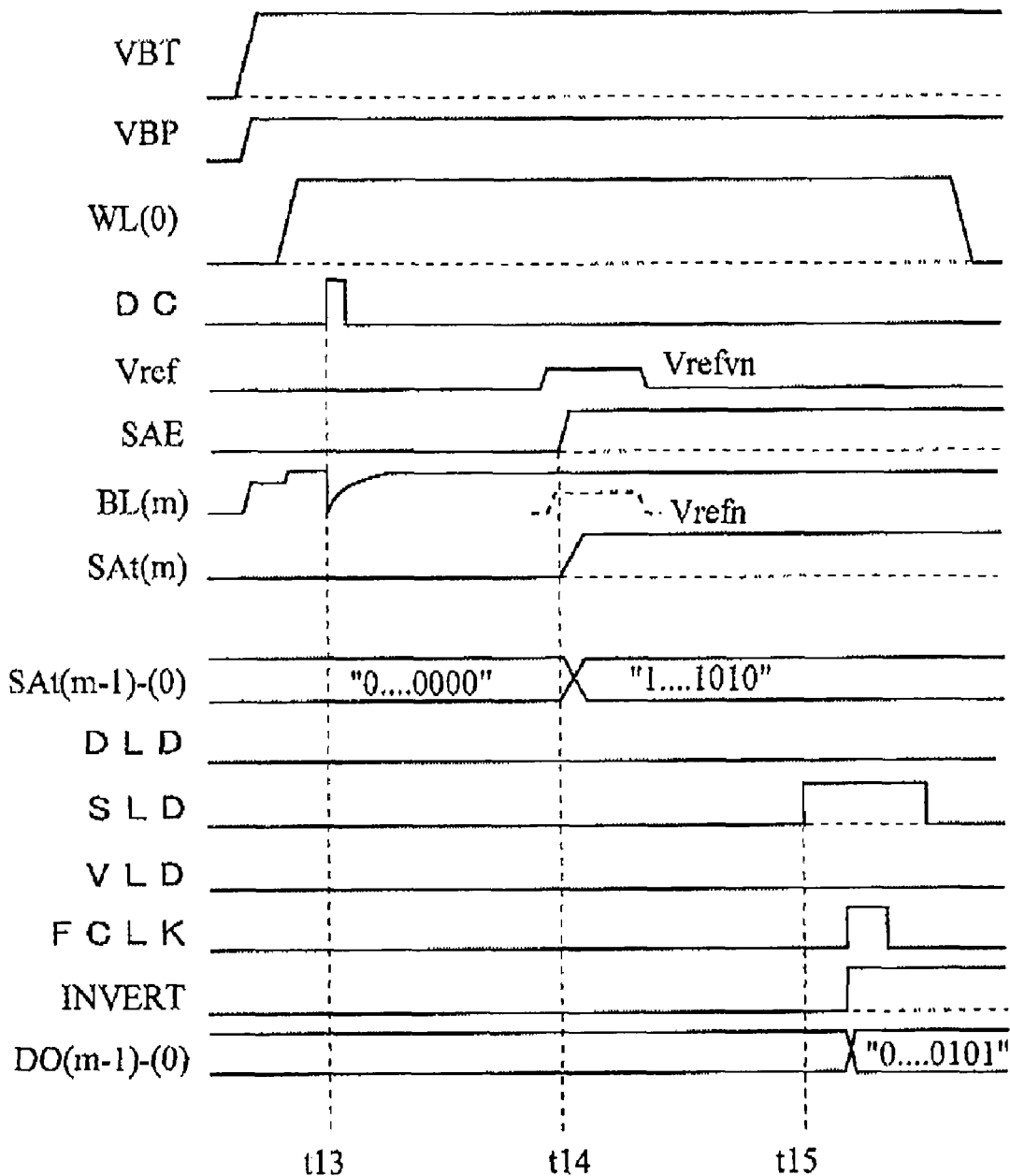
FIG. 9 is a timing chart illustrating read-data inversion operation in a semiconductor memory device of the first embodiment.

With reference to FIG. 9, a description is given of the read operation of data when the potential faulty "0" cell exists and the write data DI(j) to the cell is "0", and so the inverted data/DI(j), which is obtained by inverting the write data DI(j), is written to the cell. The inverted data/DI(j) directly read is not consistent with the written data DI(j)(thc read data is completely opposite to the written data).

In this embodiment, therefore, redundancy data indicating whether data is inverted as described above i.s stored in the memory cell 1(i, m). The redundancy data is added to the effective data. With reference to FIG. 9, therefore, after the discharge signal DC rises (at time t13), the voltage of the bit-line BL(m) increases to be equal to or more than the reference voltage Vrefn if the inverted data/DI(j) has been written to the cell. If not, the voltage of the bit-line BL(m) is less than the reference voltage Vrefn.

This is detected by the sense amplifier circuit 31 by raising the sense amplifier activation signal SAE at time t14. Specifically, if the inverted data/DI(j) is written to the cell, the true output signal SAt(m) from the sense amplifier circuit 31 in the read/write circuit 3(m) becomes "1" at time t14. The true output signal SAt(m) is stored in the data register 33 in the read/write circuit 3(m) by rising of the control signal SLD at time t15 and rising of the clock signal FCLK.

From the memory cells 1(i, 0) to 1(i, m−1) storing the effective data, data corresponding to the inverted data/DI(j) is read by the sense amplifier circuit 31 as the true output signals SAt(0) to SAt(m−1). The read data is then held in the data registers 33 in the read/write circuits 3(0) to 3(m−1) by rising of the control signal SLD at time t15 and rising of the clock signal FCLK.

When the program signal PROGRAM is set to "0", the true output signal SAt(m) of "1" will provide the inversion instruction signal INVERT of "1" When the inversion instruction signal INVERT of "1" is input to the read-data inversion circuit 37, the data stored in the data register 33 is inverted and output as the output data DO(j). Consider now that for example, the held data DQ(0), DI(1), DI(2), DI(3), . . . . , and DQ(m−1) are (1, 0, 1, 0, . . . , 0). When, therefore, the inversion instruction signal INVERT is "1", it is inverted, thus outputting data DO(0), DO(1), DO(2), DO(3), and DO(m−1) of (0, 1, 0, 1, . . . , 1).

As described above, in this embodiment, when the potential faulty "0" cell is detected and the write data to the cell is "0", the write data DI(j) is inverted and then written to the memory cell 1. The redundancy memory cell (i, m) is written with the redundancy data "1" that indicates the inversion. In reading data, the redundancy data is checked. When the redundancy data "1" is written, the read data is inverted and then output. In this way, the potential faulty "0" cell may be rescueed with a simple circuit.

Second Embodiment

Figure 10:
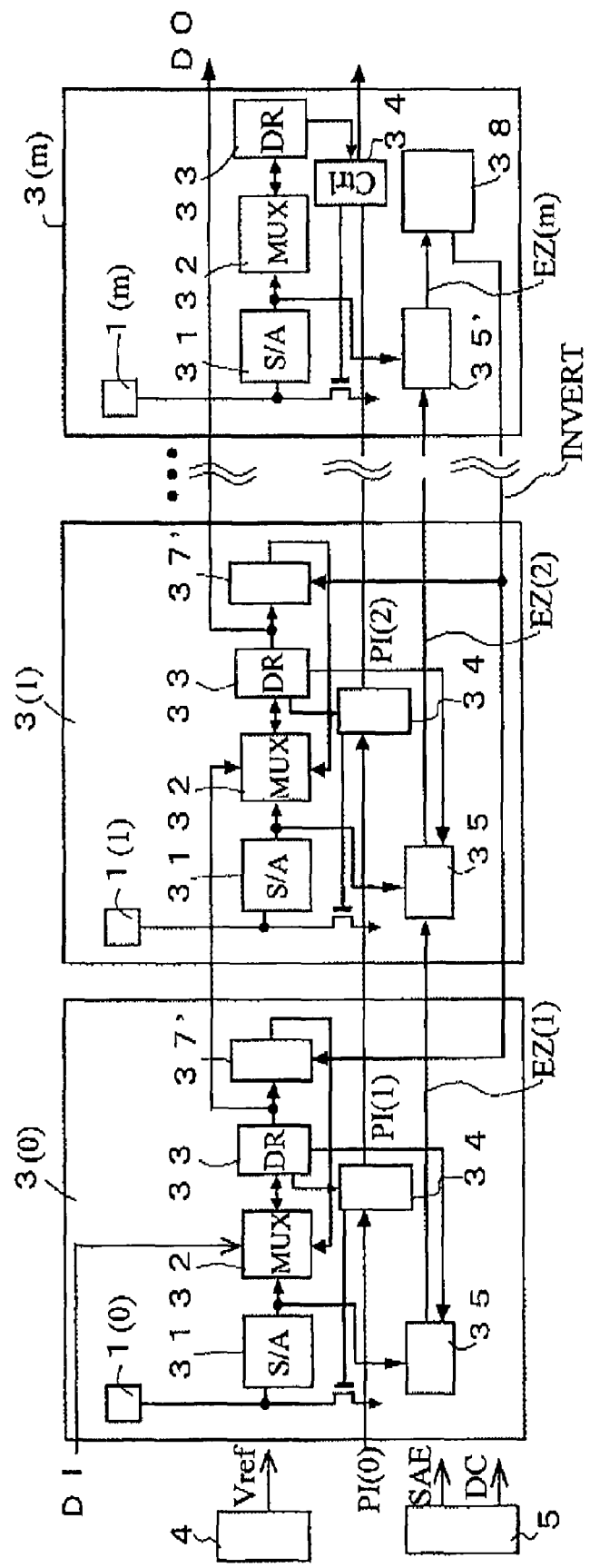
FIG. 10 is a block diagram of the configuration of a semiconductor memory device according to the first embodiment of the present invention.

With reference to FIGS. 10 and 11, a second embodiment of the present invention will now be described. Like elements as those in the first embodiment are designated with like reference numerals, and their detailed description is omitted below.

FIG. 10 is a block diagram of the configuration of a semiconductor memory device of this embodiment. In this embodiment, the read/write circuits 3(0) to 3(m) include memory cells 1(0) to (m), respectively. Each read/write circuit 3(j) may store one-bit data. The m read/write circuits 3(0) to 3(m−1) are serially connected, thus forming a m-bit memory cell array. The tail end (m+1)th read/write circuit 3(m) includes the memory cell 1 to store the redundancy data as in the first embodiment. Specifi.cally, the memory cells (0) to (m−1) store the effective data, and the memory cell (m) stores the redundancy data indicating whether data stored in the memory cell (0) to (m−1) is inverted. Note that in this embodiment, the m memory cells are connected in a line, so the word-line WL and the row decoder 6 are not necessary.

In writing data, the write data DI(0) to DI(m−1) are serially input from one data-input terminal. The multiplexer 32 or the like in each read/write circuit 3(j) transfers the data from upstream to downstream. The data register 33 in each stage thus stores the data DQ(j). This is different from the first embodiment that transfers the write data to each read/write circuit 3(j) in parallel.

This embodiment also includes one data-inversion circuit 37'. The circuit 37' serves both as the write-data inversion circuit 36 and the read-data inversion circuit 37 in the first embodiment. Specifically, the data inversion circuit 37' operates as follows. In writing data, when the inversion instruction signal INVERT is "1", the circuit 37' inverts the data DQ(j) held in the data register 33, reinputs the inverted data to the multiplexer 32, and holds again the inverted data/DQ(j) in the data register 33. In reading data, when the determination instruction signal INVERT is "1", the circuit 37' inverts the data DQ(j) held in the data register 33 and outputs the inverted data serially from the output terminal DO.

With reference to the circuit diagram in FIG. 11, a specific example configuration of the read/write circuit 3(j) in the second embodiment is described below. The read/write circuits 3(0) to 3(m−1) have the same configuration except the input signal (Vss or the signal EZ(j−1)) to the determination circuit 35 (OR circuit 352). Only the read/write circuit 3(0) is thus shown in FIG. 11 as representative of the circuits. Like elements as those in the first embodiment (FIG. 3) are designated with like reference numerals, and their detailed description is omitted below.

In this embodiment, to serially transfer the write data DI, the multiplexer 32 includes a NAND gate 326 in addition to the elements in FIG. 3. The MANI) gate 326 has an input terminal supplied with a control signal TLD and the write data DI (serial data). The NAND gate 326 also has an output terminal that outputs data to the NAND gate 325. Setting the control signal TLD to "1" and the other control signals DLD, SLD, and VLD to "0" may perform the above serial transfer.

Like the first embodiment, when the inversion instruction signal INVERT is "1", the write data DI, i.e., data held in the data register 33 is inverted by the data inversion circuit 37'. The inverted data is returned to the multiplexer 32 and is then written to the data register 33 by the control signal DLD rising in the NAND gate 322. The potential faulty "0" cell is thus detected and the write data DI to the cell is inverted when the data is "0."

The read data is inverted as follows. The true output signal Sat (j) of the sense amplifier circuit 31 is incorporated into the data register 33 by rising of the control signal SLD to "H" and rising of the clock signal FCLK (as in the first embodiment). When the "0", data held in the inversion instruction signal INVERT of "1", data held in the data register 33 is inverted by the data inversion circuit 37'. The inverted data is incorporated into the data register 33 by rising of the control signal DLD to "H" and rising of the clock signal FCLK. The inverted data is then output serially from the output terminal DO every time the clock signal FCLK rises.

Thus, although the invention has been described with respect to particular embodiments. It will be understood that various modifications and additions and the like may be made without departing from the spirit of the present invention.

What is claimed is:

1. A semiconductor memory device comprising:
   a memory cell array comprising a plurality of memory cells, each memory cell comprising an antifuse device capable of having data written thereto by breakdown of a gate dielectric film of an MOS transistor by application of a high voltage;
   a bit-line for writing or reading data from the memory cell;
   a sense amplifier comparing the bit-line's voltage and a reference voltage and determining a difference therebetween; and
   a data inversion portion generating, according to a relationship between the sense amplifier's determination and write data to be written to the memory cell, inverted write data obtained by inverting the write data, the data inversion portion also inverting, when data is read from the memory cell to which the inverted write data is written, the read data and reading out the inverted data.

2. The semiconductor memory device according to claim 1, wherein
   the data inversion portion is configured to add, when the inversion has been performed, redundancy data indicating that the inversion has been performed to the inverted write data.

3. The semiconductor memory device according to claim 2, wherein
   the data inversion portion is configured to invert the read data according to the redundancy data.

4. The semiconductor memory device according to claim 1, further comprising a reference voltage control circuit, the circuit switching the reference voltage between a first reference voltage in a normal data-read and a second reference voltage in a test and supplying the reference voltage to the sense amplifier.

5. The semiconductor memory device according to claim 1, further comprising a control circuit, the circuit controlling an amount of time from when the bit-line is discharged to when the sense amplifier circuit is activated.

6. The semiconductor memory device according to claim 1, further comprising a determination circuit determining the relationship between the sense amplifier's determination and the write data.

7. The semiconductor memory device according to claim 6, further comprising an inversion instruction portion instructing a data inversion to the data inversion portion according to the determination of the determination circuit.

8. The semiconductor memory device according to claim 6, wherein
   the data inversion portion is configured to add, when the inversion has been performed, redundancy data indicating that the inversion has been performed to the inverted write data.

9. The semiconductor memory device according to claim 8, wherein
   the data inversion portion is configured to invert the read data according to the redundancy data.

10. The semiconductor memory device according to claim 6, further comprising a reference voltage control circuit, the circuit switching the reference voltage between a first reference voltage in a normal data-read and a second reference voltage in a test and supplying the reference voltage to the sense amplifier.

11. The semiconductor memory device according to claim 6, further comprising a control circuit, the circuit controlling an amount of time from when the bit-line is discharged to when the sense amplifier circuit is activated.

12. The semiconductor memory device according to claim 1,
   wherein the memory cell comprises a selection device having a gate terminal connected to a word line, and a barrier device having a gate terminal connected to a barrier power-supply to prevent the selection device from being provided with a high voltage, and the barrier device and the selection device are serially connected between a gate terminal of the antifuse device and the bit-line.

13. The semiconductor memory device according to claim 1, wherein a determination circuit is configured to output a first output signal when the gate dielectric film of the memory cell is already broken down, and the write data does not require a destruction of the gate dielectric film, and output a second output signal in other cases.

14. The semiconductor memory device according to claim 13, wherein the determination circuit is provided in a plurality per the bit-line, and the determination circuit is configured to vary its output signal based on an output signal from another one of the determination circuits provided in a preceding-stage, as well as the relationship between the sense amplifier's determination and the write data.

15. The semiconductor memory device according to claim 13, wherein the data inversion portion is configured to add, when the inversion has been performed, redundancy data indicating that the inversion has been performed to the inverted write data.

16. The semiconductor memory device according to claim 15, wherein the data inversion portion is configured to invert the read data according to the redundancy data.

17. The semiconductor memory device according to claim 13, further comprising a reference voltage control circuit, the circuit switching the reference voltage between a first reference voltage in a normal data-read and a second reference voltage in a test and supplying the reference voltage to the sense amplifier.

18. The semiconductor memory device according to claim 13, further comprising a control circuit, the circuit controlling an amount of time from when the bit-line is discharged to when the sense amplifier circuit is activated.

19. The semiconductor memory device according to claim 13, wherein the memory cell comprises a selection device having a gate terminal connected to a word line, and a barrier device having a gate terminal connected to a barrier power-supply to prevent the selection device from being provided with a high voltage, and the barrier device and the selection device are serially connected between a gate terminal of the antifuse device and the bit-line.

* * * * *

UNITED STATES PATENT AND TRADEMARK OFFICE
CERTIFICATE OF CORRECTION

| | | |
|---|---|---|
| PATENT NO. | : 7,619,914 B2 | Page 1 of 1 |
| APPLICATION NO. | : 12/033372 | |
| DATED | : November 17, 2009 | |
| INVENTOR(S) | : Ito | |

It is certified that error appears in the above-identified patent and that said Letters Patent is hereby corrected as shown below:

On the title page, Item (73), the Assignee's information is incorrect. Item (73) should read:

-- (73) Assignee: Kabushiki Kaisha Toshiba, Tokyo (JP) --

Signed and Sealed this

Nineteenth Day of January, 2010

David J. Kappos
*Director of the United States Patent and Trademark Office*